United States Patent [19]

Miller, Jr.

[11] Patent Number: 4,791,722

[45] Date of Patent: Dec. 20, 1988

[54] METHOD OF DESIGNING AND MANUFACTURING CIRCUITS USING UNIVERSAL CIRCUIT BOARD

[75] Inventor: Grady A. Miller, Jr., Grand Prairie, Tex.

[73] Assignee: LTV Aerospace and Defense Co., Dallas, Tex.

[21] Appl. No.: 945,222

[22] Filed: Dec. 23, 1986

Related U.S. Application Data

[63] Continuation-in-part of Ser. No. 754,862, Jul. 12, 1985, abandoned.

[51] Int. Cl.⁴ .............................................. H01K 3/10
[52] U.S. Cl. .................................. 29/850; 174/68.5; 361/412
[58] Field of Search ......................... 174/68.5, 52 FP; 361/412, 413; 29/845, 850

[56] References Cited

U.S. PATENT DOCUMENTS

| | | | |
|---|---|---|---|
| 3,205,469 | 9/1965 | Frank et al. | 361/412 X |
| 3,644,792 | 2/1972 | Fields | 174/68.5 X |
| 3,917,984 | 11/1975 | Kong et al. | 174/68.5 X |
| 4,129,349 | 12/1978 | Von Roesgen | 361/413 X |
| 4,387,509 | 6/1983 | Dechelette | 29/850 |
| 4,461,061 | 7/1984 | Rock | 29/850 X |

Primary Examiner—Timothy V. Eley
Assistant Examiner—Carl J. Arbes
Attorney, Agent, or Firm—Arnold, White & Durkee

[57] ABSTRACT

A printed circuit for mounting and connecting a plurality of semiconductor devices is disclosed and includes a planar insulating substrate having multiple conductive layers disposed in overlying relationship within the planar substrate. A plurality of parallel rows of apertures for wire wrap, quick connect or stitch wire contacts are provided for mounting integrated circuit. One side of the printed circuit board includes a plurality of power and ground connections disposed between each pair of parallel rows of apertures so that filter capacitors may be mounted under each integrated circuit, thereby conserving printed circuit board space. In a preferred mode of the present invention, alternate ones of the conductive layers are coupled to a source of electrical power while all remaining conductive layers are gounded. At least two adjacent conductive layers are then utilized to minimize parasitic capacitance by completely surrounding each aperture with a portion of conductive material.

3 Claims, 2 Drawing Sheets

METHOD OF DESIGNING AND MANUFACTURING CIRCUITS USING UNIVERSAL CIRCUIT BOARD

This is a continuation-in-part of co-pending application Ser. No. 754,862 filed on July 12, 1985, now abandoned.

BACKGROUND OF THE INVENTION

This invention relates in general to printed circuit boards and in particular to printed circuit boards adapted to mount and connect a plurality of semiconductor devices. Still more particularly, this invention relates to multiplane printed circuit boards including means for minimizing parasitic capacitance.

Printed circuit boards are well known in the prior art. More specifically, certain printed circuit boards are designed to permit so-called "breadboarding" of electronic circuits to determine the feasibility of a proposed circuit layout or design prior to committing to production boards.

A conventional prior art breadboard typically consists of a flat insulating substrate which is perforated at regular intervals so as to permit insertion of electrical and electronic components and jumper wires, so that electronic circuits may be laid out and tested. Many methods exist for electrically coupling individual components together including: soldering, wire wrapping, stitch wiring and quick connects. Preferably, a printed circuit board utilized for breadboarding will permit one or more of the preceding techniques to be utilized.

One example of a prior art printed circuit board which may be utilized for breadboarding electronic circuits may be seen in U.S. Pat. No. 4,330,684 issued to Hayward. The Hayward patent discloses a printed circuit board which includes multiple bus elements plated onto the board to permit interconnection of the circuit elements to selected and common electrical points, (e.g. electrical power and ground).

Another prior art printed circuit board is disclosed in U.S. Pat. No. 3,217,208 issued to Castro. The Castro printed circuit board discloses the technique of providing apertures which permit the electrical conductors to be inserted from below to make an electrical connection with components mounted on the upper surface of the board.

Those skilled in the art will appreciate that two problems exist with known printed circuit boards. One problem involves the effective utilization of space so that a maximum number of circuit elements may be mounted onto a board of a given area. Another problem involves the minimization of possible parasitic capacitance which sometimes exists in multiplane boards.

Thus, it should be apparent that a need exists for a printed circuit board for mounting and connecting a plurality of semiconductor devices that permits maximum utilization of board space while minimizing parasitic capacitance.

THE SUMMARY OF THE INVENTION

It is therefore one object of the present invention to provide an improved printed circuit board for mounting and connecting a plurality of semiconductor devices.

It is another object of the present invention to provide an improved printed circuit board for mounting and connecting a plurality of semiconductor devices which permits a more effective utilization of the space on the printed circuit board.

It is still another object of the present invention to provide an improved printed circuit board for mounting and connecting a plurality of semiconductor devices which minimizes parasitic capacitance.

The foregoing objects are achieved as is now described. The printed circuit board of the present invention includes a planar insulating substrate having multiple conductive layers disposed in overlying relationship within the planar substrate. A plurality of parallel rows of apertures are provided for mounting integrated circuit quick connect, wirewrap, or stitchwire sockets. One side of the printed circuit boards includes a plurality of power and ground connections disposed between each pair of parallel rows of apertures so that filter capacitors may be mounted under each integrated circuit socket, thereby conserving printed circuit board space. In a preferred mode of the present invention, alternate ones of the conductive layers are coupled to a source of electrical power while all remaining conductive layers are grounded. At least two adjacent conductive layers are then utilized to minimize parasitic capacitance by completely surrounding each aperture with a portion of conductive material.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
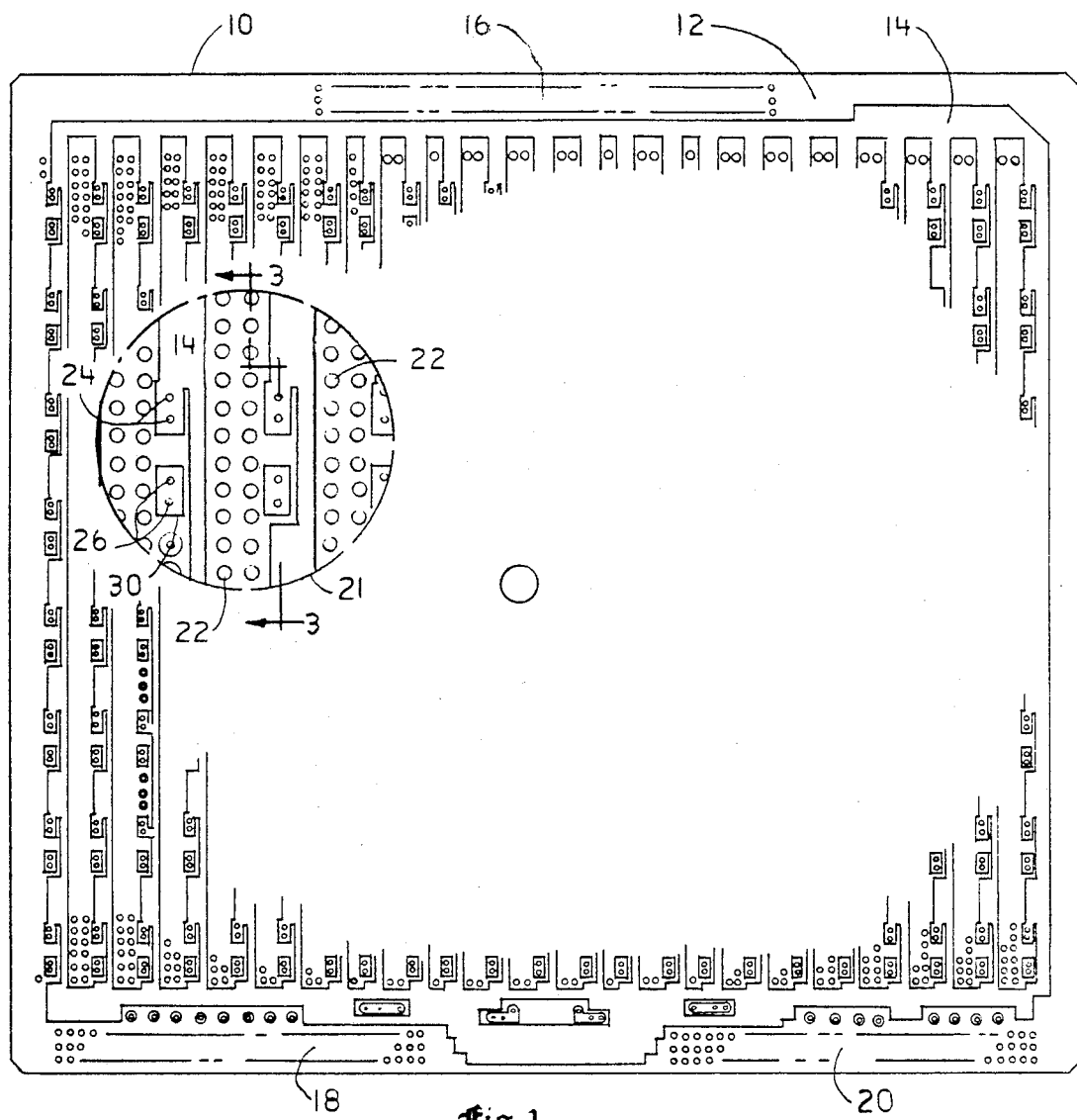
FIG. 1 depicts a plan view of the upper surface of the printed circuit board of the present invention.

With reference now to the FIGURES and in particular with reference to FIG. 1, there is depicted a plan view of the upper surface of a printed circuit board 10 of the present invention. As can be seen, the printed circuit board 10 includes a planar substrate 12 which serves to support a conductive metallic layer 14. Along one edge of the printed circuit board 10 are a plurality of apertures 16 which serve to receive a suitable edge connector for electrically connecting components mounted on the printed circuit board 10 at two various electronic circuits not shown. Additionally, a second plurality of apertures 18 and a third plurality of apertures 20 are provided and are also suitable for receiving edge connectors to permit connection of the printed circuit board 10 to other multilayer bus circuit boards and electronic circuits.

Depicted within FIG. 1 is a greatly enlarged view 21 which depicts a portion of the upper conductive surface 14 of the printed circuit board 10, and which illustrates an important feature of the present invention. As can be seen, the conductive metallic layer 14 extends vertically along the length of printed circuit board 10 between two parallel rows of apertures 22. Apertures 22 are preferably drilled in a manner which will permit mounting of an integrated circuit utilizing a dual-in-line lead system. As can be seen, a pair of apertures 24 are mounted within the metallic conductive layer 14 and, in a manner which will be explained in detail herein, are connected to a suitable electrical power source. Similarly, a pair of apertures 26 are mounted within a metallic element 30 and electrically isolated from a metallic conductive layer 14. As will be explained in greater detail below, the apertures 26 are preferably connected to ground potential.

Figure 3:
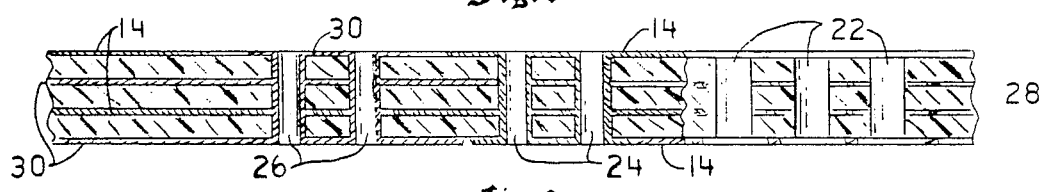
FIG. 3 depicts a sectional view of the printed circuit board of FIG. 1, and taken along line 3—3 of FIG. 1.
Figure 2:
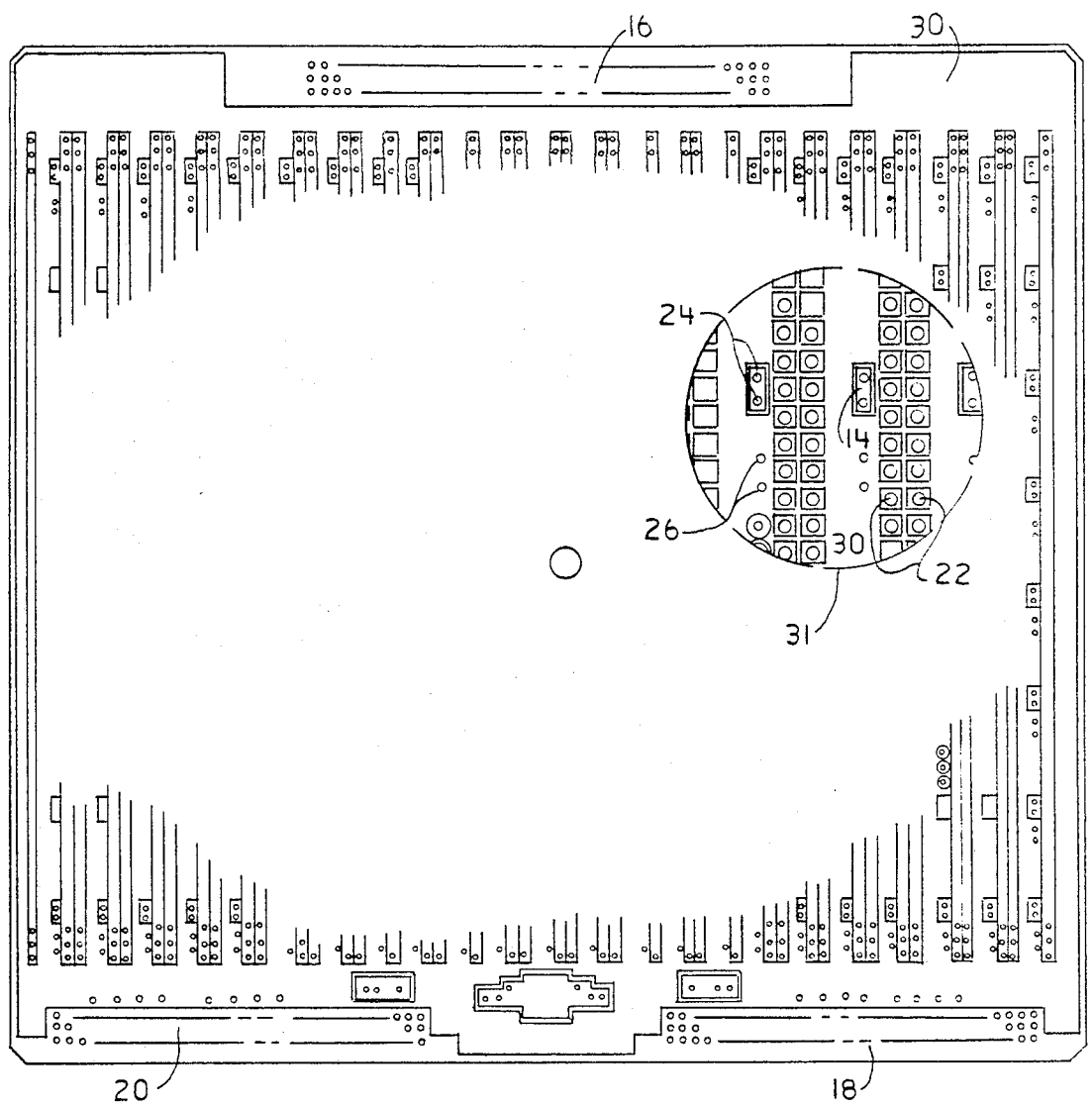
FIG. 2 depicts a plan view of the lower surface of the printed circuit board of the present invention.

Referring now to FIGS. 2 and 3, there are depicted a plan view of the lower surface of the printed circuit board 10 of the present invention and a sectional view of the printed circuit board 10 taken along line 3—3 of FIG. 1. In the depicted embodiment of the present invention, the lower surface of the printed circuit board 10 preferably includes the metallic conductive layer 30 which is preferably electrically connected to internal ground potential.

Referring now to the sectional view depicted in FIG. 3, it can be seen that the apertures 24 include plating through the intermediate insulating layers 28 and are therefore electrically coupled to the metallic layer 14 on the bottom surface of the printed circuit board 10. The metallic layer 14 is electrically isolated from the metallic layer 30. As those ordinarily skilled in the art will appreciate, the metallic layer 14 on the bottom surface of the board 10 is electrically coupled to the metallic layer 14 on the upper surface and is coupled to the inner metallic layer 14 of the printed circuit board 10, and, as mentioned earlier, is therefore coupled to a source of electrical energy.

The apertures 26, which are isolated from the metallic layer 14 on the upper surface and the inner metallic layer 14 of the printed circuit board 10, are depicted in FIG. 2 within the metallic conductive layer 30. Again, referring to FIG. 3, it may be seen that apertures 26 are plated through with the metallic layer 30 so that the metallic layer 30 on the upper surface and the inner layer 30 of the printed circuit board 10 are electrically connected to the metallic layer 30 on the lower surface of the printed circuit board 10.

Referring again to FIG. 3, the multiplane nature of the printed circuit board 10 may be understood. As can be seen, the printed circuit board 10 includes four metallic conductive layers. The upper layer 14 is preferably connected to a source of electrical energy and is connected, via the through plating of apertures 24, to the intermediate layer 14. Similarly, the conductive layer 30 on the lower surface of the printed circuit board 10 is coupled to the intermediate layer 30 within the printed circuit board 10 by the plating through apertures 26. In this manner, the printed circuit board 10 comprises a plurality of conductive metallic layers which are alternately connected to a source of electrical energy or ground potential and which are electrically isolated from each other by insulating material 28.

An important feature of the present invention may be illustrated by a reference to FIG. 3 and again by reference to FIG. 2. As can be seen, intermediate layers 30 and 14 are laid out in a manner similar to that depicted in enlarged view 31 of FIG. 2 in that each electrical component mounting aperture 22 is surrounded by a thin conductive layer which is connected to a source of electrical power at one level and connected to ground potential at another level. In this manner, each electronic component aperture 22 is electrically surrounded by both a source of electrical power and a ground potential conductive layer, thus minimizing parasitic capacitance which may occur as a result of the overlying nature of conductive layers 14 and 30.

Figure 4:
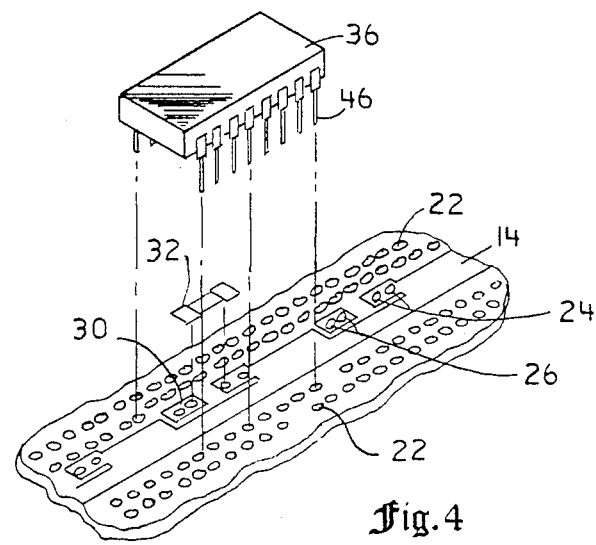
FIG. 4 depicts an exploded view of a portion of the printed circuit board of the present invention which depicts the novel filter capacitor mounting technique of the present invention.

Referring now to FIG. 4, another important feature of the present invention may be illustrated. As can be seen, apertures 26 and 24, representing ground potential and a source of electrical energy respectively, may serve to mount a filter capacitor 32. The filter capacitor 32 may simply be soldered to the conductive layer 30 and to the conductive layer 14 by placing a contact within the apertures 24 and 26 and soldering the filter capacitor 32 in place. In this manner, an integrated circuit 36 may then be mounted into an electronic socket located in apertures 22 in an overlying fashion with respect to the filter capacitor 32. Those ordinarily skilled in the art will appreciate that this novel mounting technique will permit the printed circuit board 10 to achieve a higher density of component mounting than previously known printed circuit boards can accomplish due to the novel method of mounting a filter capacitor under an integrated circuit as depicted.

Figure 5A:
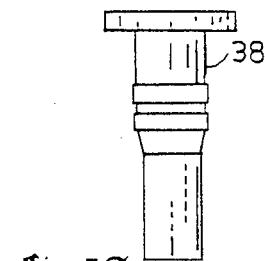
FIGS. 5A, 5B, and 5C depict various contacts which may be utilized with the printed circuit board of the present invention.
Figure 5B:
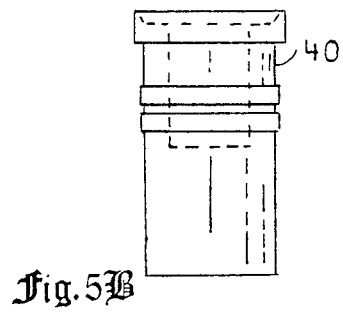
Figure 5C:
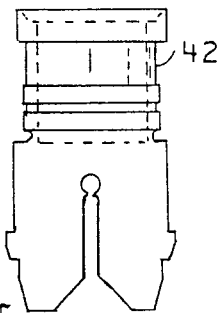

Referring now to FIGS. 5A, 5B and 5C, there are depicted a plurality of electrical connectors 38, 40, and 42. By utilizing sockets such as those depicted in the foregoing figures, it is a simple matter to electrically connect components mounted to the printed circuit board 10 utilizing a wire wrap, a stitch wire, or quick connect techniques or combination thereof without requiring special apertures to be provided within the printed circuit board 10. Further, these sockets are solder body coated to permit soldering of interconnect wires to the sockets on either side of the board.

FIG. 5A illustrates a wire welding terminal connector. One common example of a wire welding teminal is the type sold under the trademark STITCHWIRE ®. The wire welding terminal 38 is inserted into a hole in the circuit board 10, with only the top flat part protruding out of the circuit board 10. At least two different wires can then be welded to the top flat portion of the wire welding terminal 38. The type of terminal illustrated in FIG. 5A is usually inserted in what are commonly called power or return (also called ground) holes in the circuit board 10. The power or ground holes in the circuit board 10 are usually approximately one-half the size of the other holes in the board.

Referring now to FIGS. 5B and 5C, the terminals, also called connectors, are depicted to be approximately twice the diameter of the terminal of FIG. 5A. The terminals shown in FIGS. 5B and 5C go in the larger holes in the circuit board which are usually neither the power nor the ground holes. FIG. 5B illustrates a socket contact terminal connector 40. A common example of this type of terminal is the one sold under the brand name "STITCHWIRE ®". The entire terminal fits into the circuit board and receives a terminal in the cavity indicated by the dotted lines.

Referring now to FIG. 5C, a connector 42, which is a terminal wire insulator lancer, is depicted. An example of such a terminal is the one sold under the trademark "QUICK-CONNECT ®". The connector 42 of FIG. 5C is used for "breadboarding". That is, in designing a circuit, the designer will use many connectors 42, pushing the top half of the connector shown in FIG. 5C into a hole in a circuit board. During the design of the board, connections are easily and quickly made by hand by merely pushing a wire between the two jaws of the connector, as is commonly known in the art.

Typically, after a circuit is "breadboarded" using the connectors of FIG. 5C, a different brand of a circuit board must be used for the production run of the circuit when the STITCHWIRE ® socket contact terminal 40 is used in the holes of the circuit board in place of the QUICK-CONNECT ® terminal 42 of FIG. 5C. In contrast, the method of circuit production according to the present invention uses only one type of circuit board for both "breadboarding" and for production runs of the circuit that had been breadboarded. In a typical operation using the method of the present of an aperture diameter that can accept both STITCHWIRE ® socket contact terminals and QUICK-CONNECT ® wire insulator lancer terminals.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiment that fall within the true scope of the invention.

What is claimed is:

1. A method of designing and manufacturing a circuit on a circuit board, the method comprising the steps of:
    (a) placing removable wire insulator lancer terminals into predetermined holes in the circuit board and connecting first wires between certain ones of the insulator lancer terminals;
    (b) removing the lancer terminals and the first wires;
    (c) placing socket contact terminals into the predetermined holes; and
    (d) connecting second wires between certain ones of the socket contact terminals.

2. The method of claim 1 wherein the step of connecting second wires uses a computer-controlled robotic welder.

3. The method of claim 2 wherein step (a) further includes recording x and y coordinates of the lancer terminals after the lancer terminals have been placed in the predetermined holes.

* * * * *

UNITED STATES PATENT AND TRADEMARK OFFICE
CERTIFICATE OF CORRECTION

PATENT NO. : 4,791,722

DATED : December 20, 1988

INVENTOR(S) : Grady A. Miller, Jr.

It is certified that error appears in the above-identified patent and that said Letters Patent is hereby corrected as shown below:

In Column 2, line 14, replace "boards" with --board--.

In Column 5, line 16, after "present", insert --invention, after a circuit is breadboarded on the circuit board 10, the x,y coordinates of the terminal locations are put into the control system of a computer-controlled robotic welder such as the one manufactured by Stitchwire Systems of Newbury Park, California. Then, with minimal supervision by an operator, the robotic welder automatically welds wires to all the terminals that have been inserted into the circuit board 10.
   This method of manufacture in which the same circuit board is used for both breadboarding and for stitchwiring is made possible by the judicious and inventive selection--.

Signed and Sealed this

Twentieth Day of June, 1989

*Attest:*

DONALD J. QUIGG

*Attesting Officer*　　　　　*Commissioner of Patents and Trademarks*